United States Patent
Lee et al.

(10) Patent No.: US 11,837,470 B2
(45) Date of Patent: Dec. 5, 2023

(54) METHOD OF FABRICATION AND CONTROL OF NANO-STRUCTURE ARRAY BY ANGLE-RESOLVED EXPOSURE IN PROXIMITY-FIELD NANO PATTERNING

(71) Applicant: SAMSUNG ELECTRONICS CO., LTD., Suwon-si (KR)

(72) Inventors: Jisun Lee, Suwon-si (KR); Seokwoo Jeon, Daejeon (KR); Sanghyun Nam, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 277 days.

(21) Appl. No.: 17/229,478

(22) Filed: Apr. 13, 2021

(65) Prior Publication Data

US 2021/0335601 A1 Oct. 28, 2021

(30) Foreign Application Priority Data

Apr. 22, 2020 (KR) .................. 10-2020-0048876

(51) Int. Cl.
*H01L 21/027* (2006.01)
*G03F 1/26* (2012.01)
(Continued)

(52) U.S. Cl.
CPC ............ *H01L 21/0275* (2013.01); *G03F 1/26* (2013.01); *G03F 7/201* (2013.01); *H01L 21/02603* (2013.01); *H01L 21/02642* (2013.01); *H01L 29/0673* (2013.01); *H01L 29/42392* (2013.01); *H01L 29/66439* (2013.01); *H01L 29/66742* (2013.01); *H01L 29/775* (2013.01); *H01L 29/78696* (2013.01)

(58) Field of Classification Search
CPC ... H01L 21/0275; H01L 21/0274; G03F 1/26; G03F 7/201; G03F 7/70408; G03F 7/7035; G03F 7/70283; G03F 7/703
See application file for complete search history.

(56) References Cited

U.S. PATENT DOCUMENTS

| 6,510,263 B1 * | 1/2003 | Maisenholder .... G02B 6/12007 385/37 |
| 7,704,684 B2 | 4/2010 | Rogers et al. |
| 2006/0286488 A1 * | 12/2006 | Rogers ................ G03F 7/70283 355/71 |

FOREIGN PATENT DOCUMENTS

| KR | 10-2006-0109477 A | 10/2006 |
| KR | 10-2014-0017532 A | 2/2014 |

OTHER PUBLICATIONS

Communication dated Sep. 14, 2021, issued by the Korean Patent Office in counterpart Korean Patent Application No. 10-2020-0048876.

(Continued)

*Primary Examiner* — Stewart A Fraser
(74) *Attorney, Agent, or Firm* — Sughrue Mion, PLLC

(57) ABSTRACT

A method for fabricating a nano-structure includes: providing a phase mask having an uneven lattice structure to contact a photoresist film; exposing the photoresist film to a light through the phase mask such that the light is obliquely incident on a surface of the photoresist film; and developing the photoresist film to form a nano-structure.

6 Claims, 14 Drawing Sheets
(3 of 14 Drawing Sheet(s) Filed in Color)

(51) Int. Cl.
  *G03F 7/20*    (2006.01)
  *H01L 21/02*   (2006.01)
  *H01L 29/06*   (2006.01)
  *H01L 29/775*  (2006.01)
  *H01L 29/786*  (2006.01)
  *H01L 29/66*   (2006.01)
  *H01L 29/423*  (2006.01)

(56) References Cited

OTHER PUBLICATIONS

Seokwoo Jeon et al., "Fabricating complex three-dimensional nanostructures with high-resolution conformable phase masks", PNAS, vol. 101, No. 34, Aug. 24, 2004, pp. 12428-12433, 6 pages total.

Timothy Y. M. Chan et al., "Photonic band-gap formation by optical-phase-mask lithography", Physical Review E, 73, 046610, DOI: 10.1103/PhysRevE.73.046610, Apr. 26, 2006, pp. 1-11, 11 pages total.

Debashis Chanda et al., "Phase tunable multilevel diffractive optical element based single laser exposure fabrication of three-dimensional photonic crystal templates", Applied Physics Letters, 91, 061122, DOI: 10.1063/1.2768867, Aug. 10, 2007, 4 pages total.

Seokwoo Jeon et al., "Three dimensional nanoporous density graded materials formed by optical exposures through conformable phase masks", Applied Physics Letters, 89, 253101, DOI: 10.1063/1.2405386, Dec. 18, 2006, 4 pages total.

Junyong Park et al., "Rapid, High-Resolution 3D Interference Printing of Multilevel Ultralong Nanochannel Arrays for High-Throughput Nanofluidic Transport", Advanced Materials, 27, DOI: 10.1002/adma.201503746, 2015, pp. 8000-8006, 7 pages total.

Sang-Hyeon Nam et al., "Rapid and Large-Scale Fabrication of Full Color Woodpile Photonic Crystals via Interference from a Conformal Multilevel Phase Mask", Advanced Functional Materials, 29, DOI: 1904971,10.1002/adfm.201904971, 2019, 10 pages total.

\* cited by examiner

METHOD OF FABRICATION AND CONTROL OF NANO-STRUCTURE ARRAY BY ANGLE-RESOLVED EXPOSURE IN PROXIMITY-FIELD NANO PATTERNING

CROSS-REFERENCE TO THE RELATED APPLICATION

This application claims priority to and benefits of Korean Patent Application No. 10-2020-0048876 under 35 U.S.C. § 119 filed on Apr. 22, 2020 in the Korean Intellectual Property Office, the disclosure of which is incorporated herein in its entirety by reference.

BACKGROUND

1. Technical Field

Example embodiments in the present disclosure relate to a nano-structure, and more, to a method for fabricating a nano-structure using a proximity-field nano-patterning (PnP) method.

2. Description of the Related Art

As technologies for a fine device such as a nano-device are developed in various industries, requirements for fabricating a nano-structure having various shapes are being increased. For example, using a three-dimensional (3D) structure instead of a two-dimensional (2D) structure has been considered as a next generation technology in a semiconductor industry to overcome limitation of a conventional refining process and to improve performance of a device. Furthermore, demands in various industries for a 3D nano-structure as an optical element, an electrochemical material, a sensor, or other structure materials are increasing. In a conventional method, a plurality of 2D structures are formed according to layer-by-layer (LBL) deposition to fabricate a 3D nano-structure. However, the LBL deposition method has a low efficiency and costs much. Thus, in order to address the disadvantages of the LBL deposition method, a method for fabricating a 3D nano-structure in a single process by using interference of a laser light source or the like is being studied.

Laser interference lithography uses coherence of a laser beam. According to the laser interference lithography, a single laser beam is divided into a plurality of laser beams through an optical system, and the laser beams are irradiated onto a photoresist film. A 3D periodic interference pattern is formed in the photoresist film by coherence of the laser beams. The laser-exposed photoresist film is etched or developed to have the 3D periodic interference pattern. The laser interference lithography needs a complicated optical system including lenses, mirrors, beam splitters, and the like. Thus, its costs may be large, and an applicable size may be hardly increased, and reproducibility may be low.

A proximity-field nano-patterning (PnP) method uses a phase mask to increase an applicable size and reproducibility with a high process speed to address the disadvantages of the laser interference lithography. The phase mask is a transparent substrate having a lattice structure (grid structure) with a 2D pattern or a one-dimensional (1D) pattern, and may be formed of an elastomer such as polydimethylsiloxane (PDMS) or the like. In a light-exposure process of the PnP method, a single laser beam may be irradiated vertically onto a surface of a photoresist film, which conformally contacts the lattice structure of the phase mask. The laser beam is diffracted and divided into a plurality of laser beams when passing through the lattice structure of the phase mask. The diffraction of the laser beam may be determined or varies depending on a wavelength of the laser beam, a refractivity of the phase mask and the photoresist film, a depth of the lattice structure, a period of the lattice structure, or the like. The laser beams interfere with one another in the photoresist film to form a 3D periodic interference pattern, and the photoresist film may be patterned by a same method as the laser interference lithography. Angles and directions of the divided laser beams are symmetrical with each other. Thus, a photoresist film patterned by using a phase mask having a lattice structure with a 2D pattern may have a symmetrical 3D structure such as body-centered-cubic (BCC) or body-centered-tetragonal (BCT). A photoresist film patterned by using a phase mask having a lattice structure with a 1D pattern may have a hexagonal channel structure.

As researches and developments for fabricating various 3D symmetrical structures by changing a design of a phase mask have been conducted, fabricating a diamond-like symmetrical structure with a woodpile shape has been reported. However, there have been very little researches and developments other than a design of a phase mask and some light-exposure factors.

SUMMARY

Example embodiments in this disclosure provide a method for fabricating a nano-structure, which may not be obtained by a conventional method, by using a PnP method with adjusting a light-exposure angle.

According to an embodiment, a method for fabricating a nano-structure may include providing a phase mask having an uneven lattice structure to contact a photoresist film; exposing the photoresist film to a light through the phase mask such that the light is obliquely incident on a surface of the photoresist film; and developing the photoresist film to form a nano-structure.

In an embodiment, the uneven lattice structure may have an one-dimensional lattice structure including protrusions extending in a direction. The nano-structure may include a plurality of channels extending in a horizontal direction.

In an embodiment, lines connecting four channels adjacent to each other in a cross-sectional view of the photoresist film may form a rectangular shape.

In an embodiment, an incidence angle of the light on the photoresist film may satisfy the following formula:

$$\sin^{-1}\left[\frac{1}{n_i}\left(\frac{2\lambda}{P} - n_{pr}\right)\right] < \Theta_i < \sin^{-1}\left[\frac{1}{n_i}\left(n_{pr} - \frac{\lambda}{P}\right)\right],$$

where $n_i$ is a refractive index of the phase mask, $n_{pr}$ is a refractive index of the photoresist film, $\lambda$ is a wavelength of the light in vacuum, P is a period of the uneven lattice structure, and $\theta_i$ is the incidence angle of the light on the photoresist film.

In an embodiment, the phase mask may have a prism shape including an inclined surface with the uneven lattice structure. The photoresist film may be disposed on the inclined surface so that the light is irradiated on the photoresist film through a lower surface of the prism shape.

In an embodiment, the phase mask may include polydimethylsiloxane (PDMS).

In an embodiment, the phase mask may include a lattice portion including the uneven lattice structure and a film portion combined with the lattice portion. The lattice portion has a modulus greater than the film portion.

According to an embodiment, a method for fabricating a nano-structure may include: preparing a photoresist film including an incident surface having an uneven lattice structure; exposing the photoresist film to a light such that the light is obliquely incident on a surface of the photoresist film; and developing the photoresist film to form a nano-structure.

In an embodiment, an incidence angle of the light on the photoresist film may also satisfy the above formula.

In an embodiment, in order to prepare the photoresist film, a mold may be provided on a preliminary photoresist film. The mold may include a pressing surface with a shape corresponding to the uneven lattice structure. The mold may be pressed toward the preliminary photoresist film to imprint the uneven lattice structure on the preliminary photoresist film.

According to the embodiments of the disclosure, a nano-structure, which may not be obtained by a conventional PnP method, may be obtained by adjusting an incidence angle of a light on a photoresist film.

Furthermore, the incidence angle of the light may be effectively adjusted by using a phase mask having a prism shape even when it is difficult to arrange a light-exposure apparatus.

BRIEF DESCRIPTION OF THE DRAWINGS

The patent application file contains at least one drawing sheet executed in color. Copies of this patent application publication with the color drawings will be provided by the Office upon request and payment of the necessary fee.

DETAILED DESCRIPTION OF THE EMBODIMENTS

Figure 1:
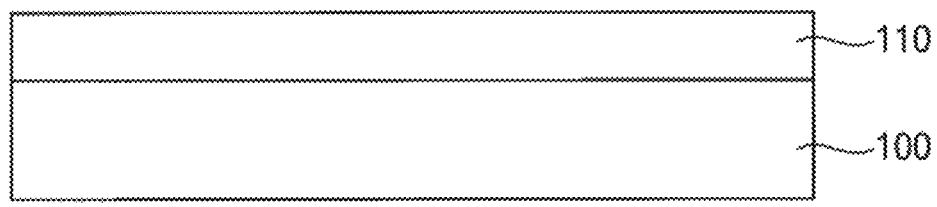
FIGS. 1, 2, 3, 4 and 5 are cross-sectional views illustrating a method for fabricating a nano-structure using a PnP process, according to an embodiment.

Various embodiments will be described more fully hereinafter with reference to the accompanying drawings. These embodiments are all example embodiments of the inventive concept. The inventive concept may, however, be embodied in many different forms and should not be construed as limited to the embodiments set forth herein. Rather, these embodiments are provided such that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 2, 3, 4 and 5 are cross-sectional views illustrating a method for fabricating a nano-structure using a PnP process, according to an embodiment.

Referring to FIG. 1, a photoresist film 110 is formed on a base substrate 100.

The base substrate 100 may include silicon, quartz, sapphire, a polymer, a metal or a combination thereof. The polymer may include polymethylmethacrylate (PMMA), polyethylene terephthalate (PET), polycarbonate (PC), polyimide (PI), polyamide (PA), polypropylene (PP) or a combination thereof.

A photoresist composition may be coated on the base substrate 100, and may be soft-baked, for example, at about 50° C. to about 100° C. to form the photoresist film 110. A time for soft-baking may be adjusted as desired. For example, the soft-baking may be performed for about 5 minutes to about 3 hours.

The photoresist composition for forming the photoresist film 110 may include an organic-inorganic hybrid material, hydrogel, a phenolic resin, an epoxy resin, or the like, which may be cross-linked by light exposure. For example, SU-8 series, KMPR series, ma-N 1400, which are from MicroChem, NR5-6000p from Futurrex, or the like may be used for the photoresist composition.

Figure 2:
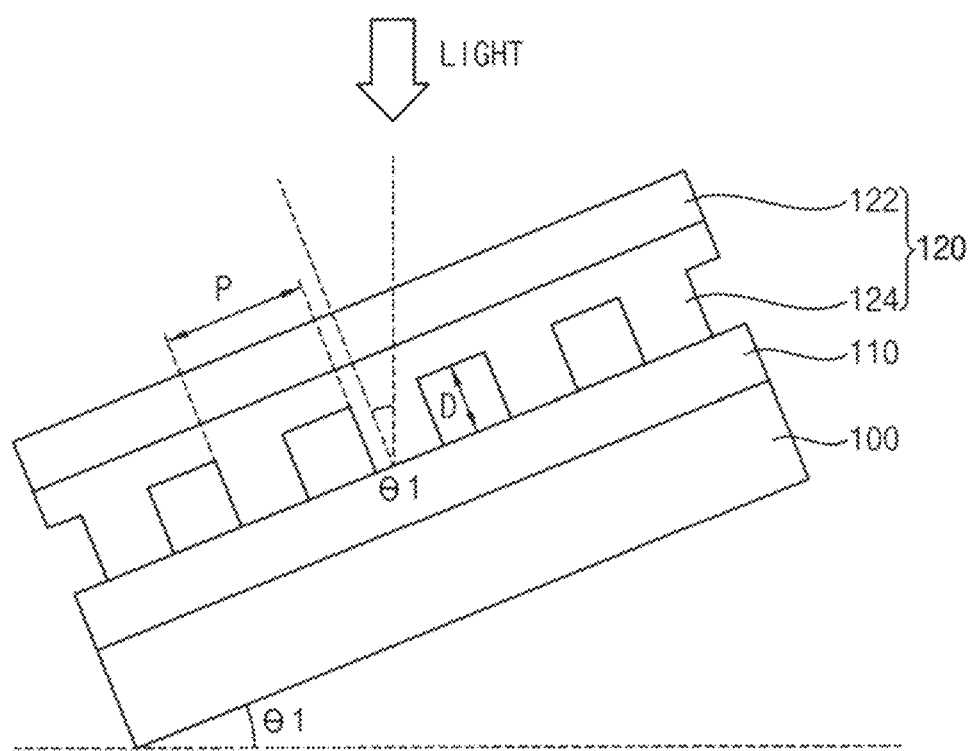

According to an embodiment, the photoresist film 110 may be patterned by a PnP method. Referring to FIG. 2, a phase mask 120 is disposed to contact an upper surface of the photoresist film 110, which may be a light-incident surface. A three-dimensionally distributed (3D-distributed) light is irradiated on the photoresist film 110 through the phase mask 120. A surface of the phase mask 120 contacting the photoresist film may have an uneven shape with a lattice structure.

In the PnP process, the photoresist film 110 may be patterned according to a periodic 3D distribution of a light passing through the phase mask 120. A light passing through the phase mask 120 is periodically 3D-distributed by interference effect. Thus, the photoresist film 110 may be three-dimensionally exposed (3D-exposed) to a light. The phase mask 120 may have a convexo-concave lattice structure formed on a surface thereof, through which a light passes. The phase mask 120 may include a flexible elastomer material. When the phase mask 120 contacts the photoresist film 110, the phase mask 120 may spontaneously adhere to or conformal-contact a surface of the photoresist film 110 by a Van der Waals force.

When a laser beam having a wavelength similar to a period of the lattice-structure of the phase mask 120 is irradiated onto the phase mask 120, a 3D-distributed light may be formed by a Talbot effect. When the photoresist film 110 is formed from a negative-tone photoresist composition, cross-linking of a resin may selectively occur in a portion where light intensity is relatively high by constructive interference, and may hardly occur in a remaining portion where light intensity is relative low. Thus, the remaining portion, which is barely or not light-exposed, may be removed in a developing process. As a result, a nano-structure having channels arranged with a period of hundreds of nanometers to micrometers may be obtained. After the developing process, the photoresist film may be dried.

According to an embodiment, the phase mask 120 used in the PnP process may include a material such as polydimetylsiloxane (PDMS), polyurethane acrylate (PUA), perfluoropolyether (PFPE), or the like.

An exposing dose energy of the light-exposure process may be about 10 mJ/cm$^2$ to about 300 mJ/cm$^2$. The light used for the light-exposure process may have a wavelength corresponding to a ultraviolet (UV) ray. For example, a laser beam having a wavelength of about 300 nm to about 400 nm may be used. However, the embodiments are not limited thereto, and lights having various wavelengths may be used for the light-exposure process.

According to an embodiment, a light such as a laser beam may be obliquely incident on a surface of the photoresist film 110. Here, the obliquely incident light may be a light beam, ray or component having a maximum intensity in the light output from a light source or a light-exposure apparatus. An incidence angle θ1 of the light may be determined depending on a shape of a desired nano-structure.

According to an embodiment, the photoresist film 110 and the phase mask 120 may be inclined by a same angle as the incidence angle θ1 of the light so that a vertically downward-directed light may enter a surface of the photoresist film 110 with the incidence angle θ1.

Figure 3:
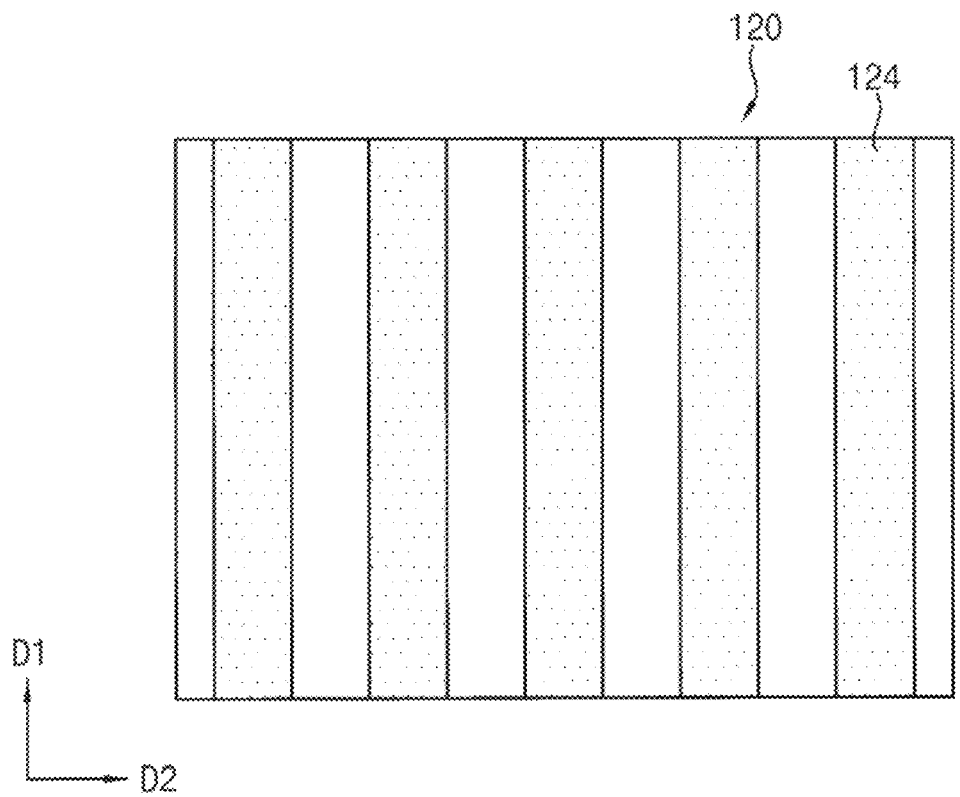

Referring to FIGS. 2 and 3, a surface of the phase mask 120 may have an one-dimensional (1D) lattice pattern, according to an embodiment. For example, the phase mask 120 may include a film portion 122 and a lattice portion 124. The lattice portion 124 may include a plurality of protrusions that protrude vertically from the film portion 122 and extend along a first direction D1 in a plan view. The protrusions may be arranged along a second direction D2 perpendicular to the first direction D1. According to another embodiment, the phase mask 120 may have a two-dimensional lattice pattern so that protrusions thereof may extend along the first direction D1 and the second direction D2 to cross each other, or may have an island shape.

According to an embodiment, the lattice portion 124 may have a modulus greater than the film portion 122 so that a profile of the uneven lattice structure may be improved while maintaining flexibility of the phase mask 120. According to an embodiment, the film portion 122 and the lattice portion 124 may include PDMS. The lattice portion 124 may include PDMS with increased hard segments therein to have a modulus higher than the film portion 122. The PDMS with increased hard segments may be obtained by reaction of PDMS having a hydroxyl end group with diisocyanate and a chain extender (diol or diamine).

According to an embodiment, diffraction of a light passing through the phase mask 120 may be adjusted depending on a combination of an incidence angle of the light, a wavelength of the light, a period P (pitch of protrusions) of the lattice portion 124 and a depth D of the lattice portion 124 to form a nano-structure having channels with a desired arrangement.

For example, in order to form a nano-structure in which lines connecting four adjacent channels in a cross-sectional view form a substantially rectangular shape, an incidence angle θ1 of a light incident on an upper surface (contact surface) of the photoresist film 110 may be about 17° to about 20°. Furthermore, a wavelength of the light may be about 350 nm to about 370 nm. Furthermore, a period P of the lattice portion 124 may be about 350 nm to about 500 nm. Furthermore, a depth D of the lattice portion 124 may be about 100 nm to about 300 nm.

For example, the light-exposed photoresist film 110 may be baked at about 50° C. to about 100° C. to form the nano-structure. A time for baking may be adjusted as desired. For example, the baking may be performed for about 5 minutes to about 30 minutes.

Figure 4:
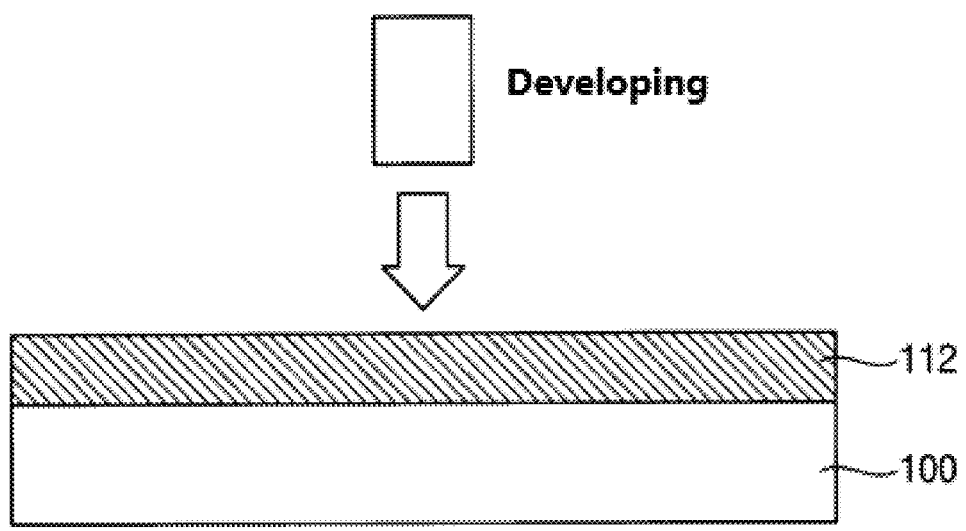
Figure 5:
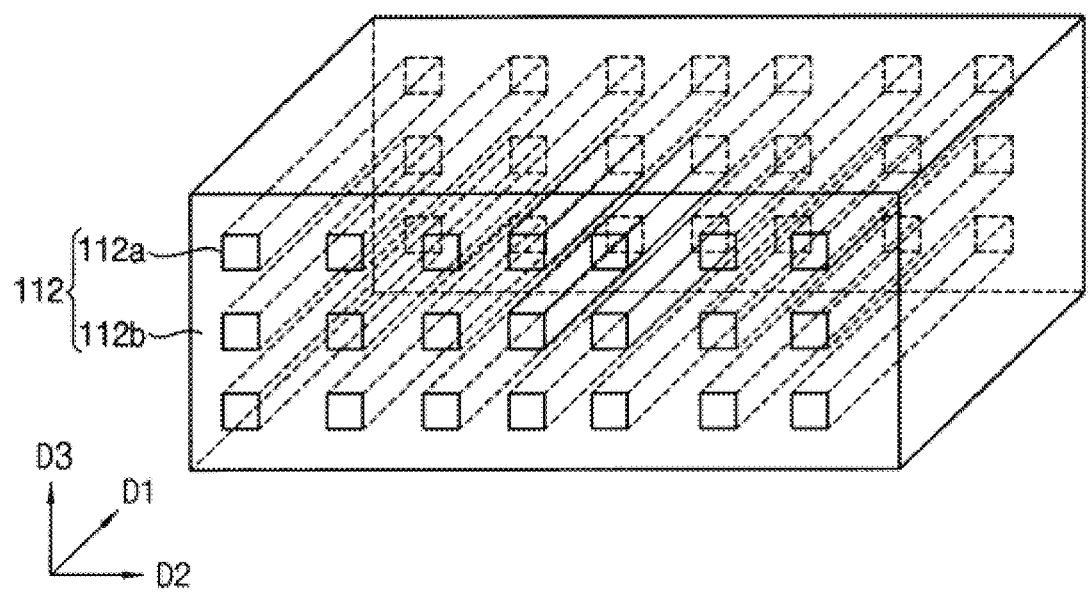

Referring to FIGS. 4 and 5, the light-exposed photoresist film 110 may be developed to form a nano-structure 112. For example, when the photoresist film 110 is formed from a negative-tone photoresist composition, a portion 112b where light intensity is relatively high by constructive interference, may remain, and a remaining portion where light intensity is relative low, may be removed by a developer (developer solution). As a result, a nano-structure 112 including channels 112a corresponding to the remaining portion may be obtained.

Referring to FIG. 5, the channels 112a may extend along a first direction D1. Furthermore, the channels 112a may be spaced apart from and adjacent to each other along a second direction D2 and a third direction D3, which are substantially perpendicular to the first direction D1. Thus, lines connecting four adjacent channels in a cross-sectional view may form a substantially rectangular shape. Each of the channels may have a substantially rectangular share in a cross-section view.

The developer may include propylene glycol monomethyl ether acetate (PGMEA), ethyl lactate, diacetone alcohol, tetramethylammonium hydroxide (TMAH), a developer solution for Su-8, or the like.

After developed, the photoresist film 110 may be rinsed by deionized water, an alcohol such as ethanol or isopropyl alcohol, or the like to obtain the nano-structure.

According to the present embodiment, a nano-structure, which may not be obtained by a conventional PnP process, may be obtained by adjusting an incidence angle of a light incident on a photoresist film.

According to the present embodiment, a photoresist film may be inclined to adjust an incidence angle of a light vertically incident on the photoresist film. However, embodiments are not limited thereto, and various other methods may be used for adjusting the incidence angle.

Figure 6:
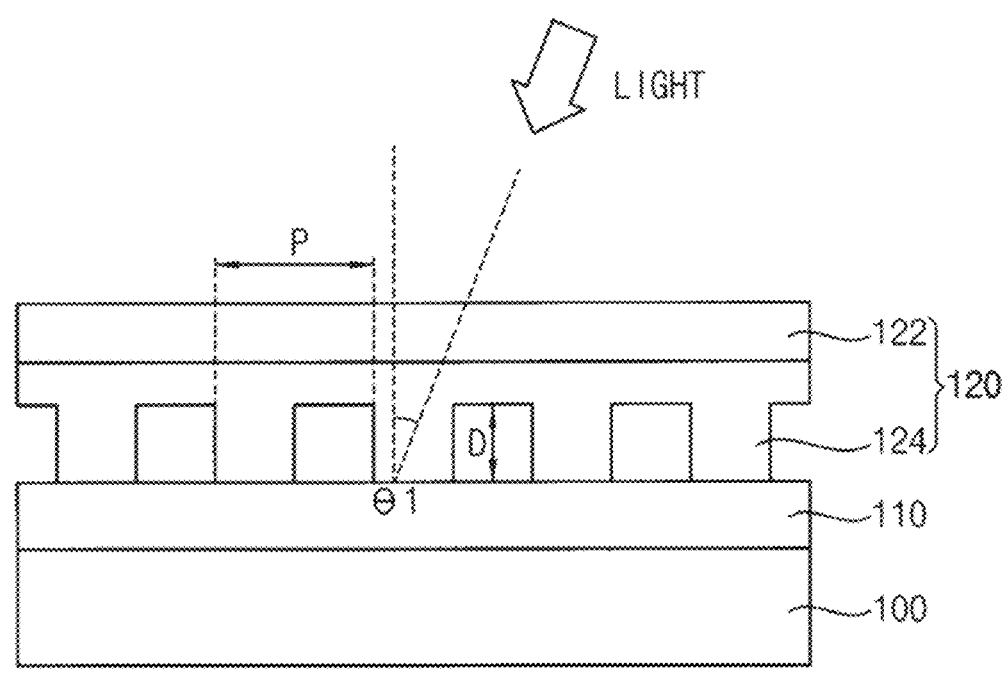
FIG. 6 is a cross-sectional view illustrating a light-exposure process in a method for fabricating a nano-structure, according to an embodiment.

For example, FIG. 6 is a cross-sectional view illustrating a light-exposure process in a method for fabricating a nano-structure, according to an embodiment. Referring to FIG. 6, a phase mask 120 and a photoresist film 110 is disposed to be parallel with a horizontal direction or a ground surface. An incidence angle θ1 of a light entering the photoresist film 110 through the phase mask 120 may be adjusted by inclining a light-exposure apparatus.

FIGS. 7, 8, 9 and 10 are cross-sectional views illustrating a method for fabricating a phase mask having a prism shape, and a method for fabricating a nano-structure using a PnP method, according to embodiments. According to an embodiment, a phase mask having a prism shape may be used for adjusting an incidence angle of a light incident on a photoresist film. For example, the phase mask may include an inclined surface with an uneven lattice structure.

Figure 7:
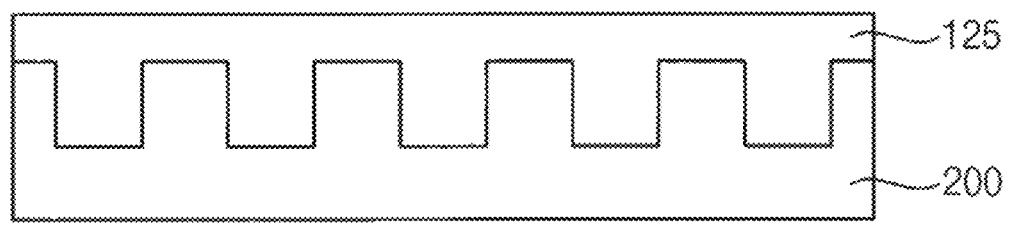
FIGS. 7, 8, 9 and 10 are cross-sectional views illustrating a method for fabricating a phase mask having a prism shape and a method for fabricating a nano-structure using a PnP method, according to embodiments.

Referring to FIG. 7, an elastomer composition is provided in a mold 200 having an uneven surface, and then cured to form a lattice elastomer 125. For example, the lattice elastomer 125 may include PDMS modified to have more hard segments.

Figure 8:
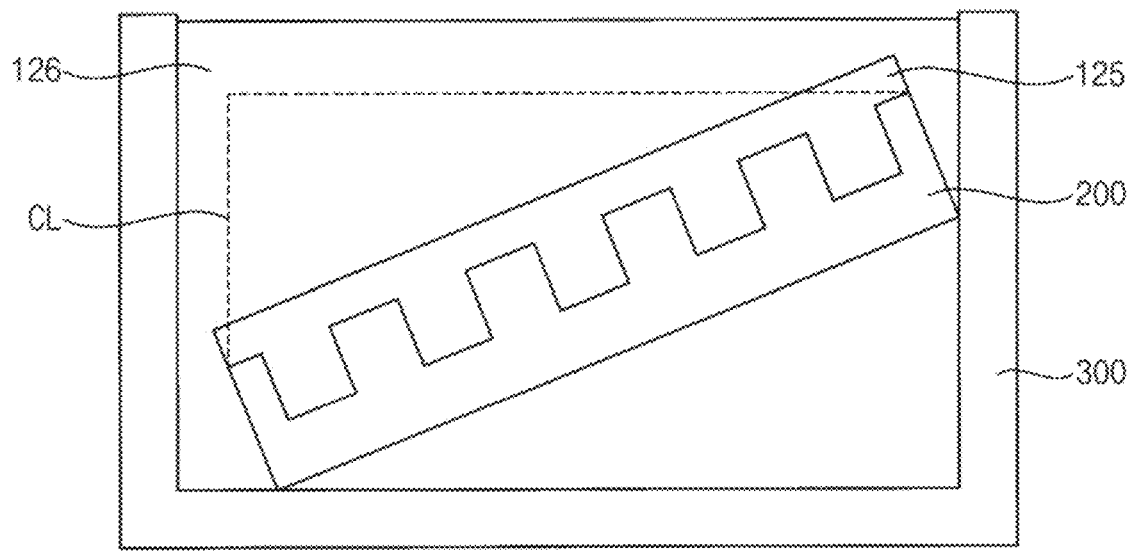

Referring to FIG. 8, the lattice elastomer 125 combined with the mold 200 is disposed in a container 300 to be inclined to a bottom surface of the container 300. An elastomer composition is provided in the container 300 to surround the lattice elastomer 125 and the mold 200, and cured to form a soft elastomer 126. For example, the soft elastomer 126 may include PDMS having a modulus less than the lattice elastomer 125.

Figure 9:
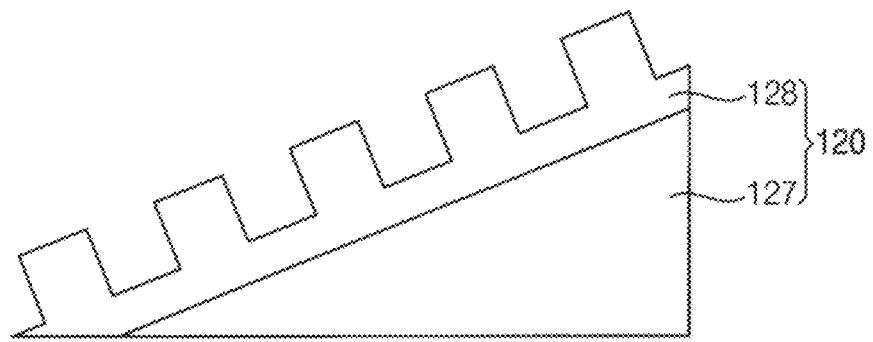
Figure 10:
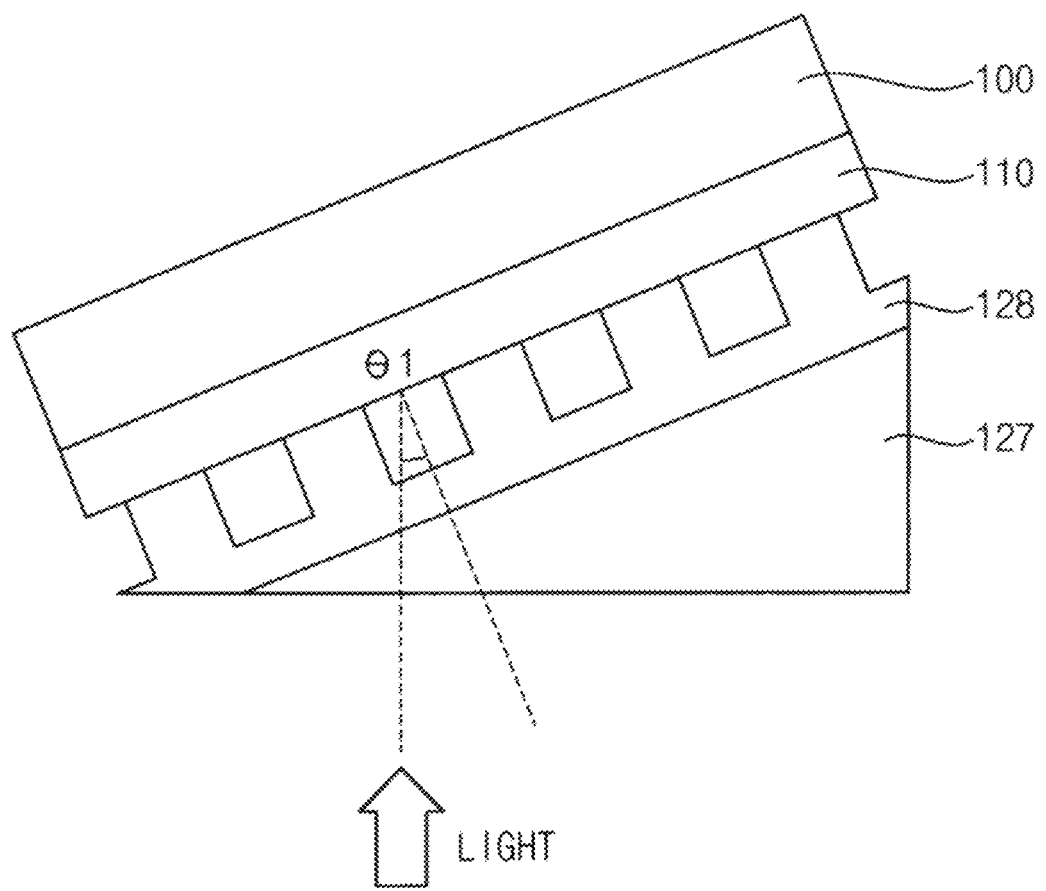

Referring to FIGS. 9 and 10, the soft elastomer 126 and the lattice elastomer 125 may be cut along a cutting line CL to obtain a phase mask 120 having an inclined surface with a uneven lattice structure, as illustrated FIG. 9. The phase mask 120 may have a jig shape including an inclined surface, and may include a lattice portion 128, which is formed from the lattice elastomer 125, and a supporting portion 127 which is formed from the soft elastomer 126.

Referring to FIG. 10, a photoresist film 110 may be disposed on the inclined surface of the phase mask 120. Thereafter, a light is irradiated on the photoresist film 110 through a lower surface of the phase mask 120. The photoresist film 110 may be combined with a base substrate 100 supporting the photoresist film 110 to be disposed on the phase mask 120.

FIGS. 11, 12, 13, 14, 15 and 16 are cross-sectional views illustrating a method for fabricating a nano-structure using a PnP process, according to an embodiment.

Figure 11:
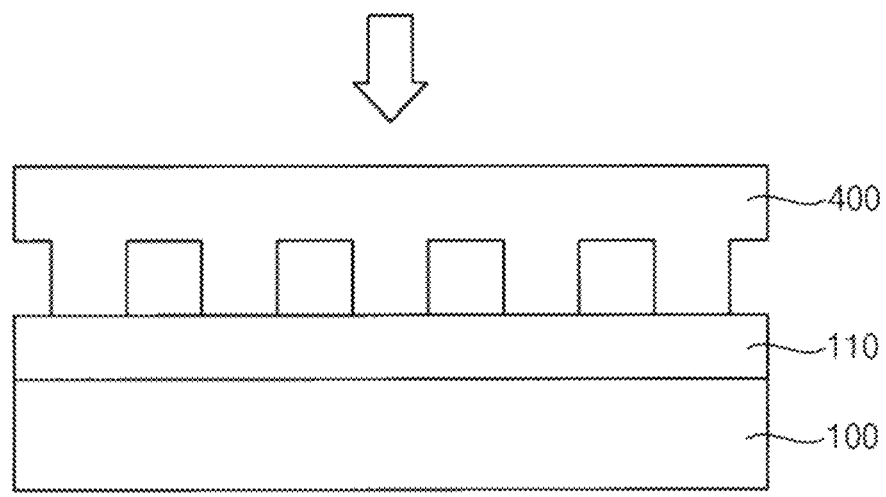
FIGS. 11, 12, 13, 14, 15 and 16 are cross-sectional views illustrating a method for fabricating a nano-structure using a PnP method according to an embodiment.
Figure 12:
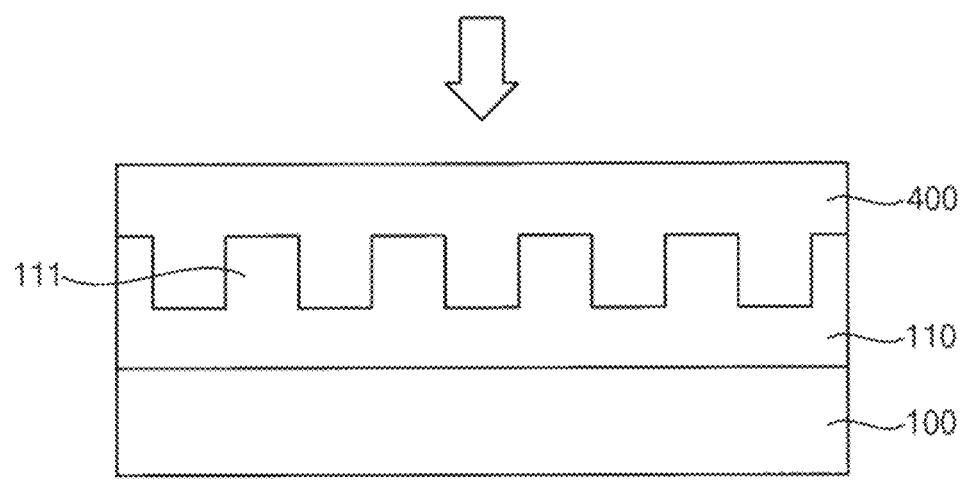
Figure 13:
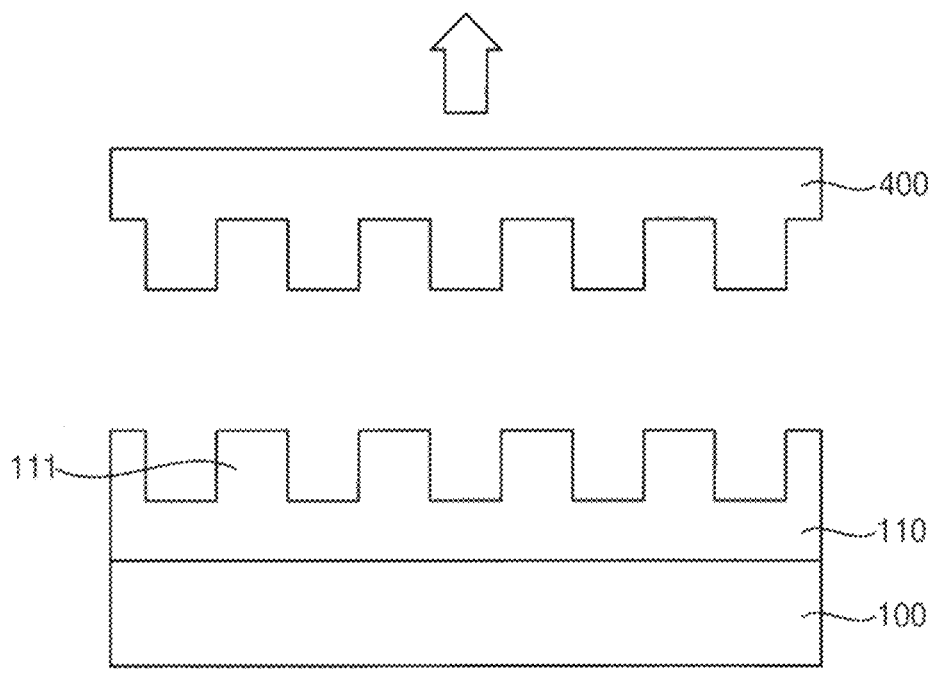

Referring to FIGS. 11, 12 and 13, a mold 400, which has a pressing surface with a shape corresponding to an uneven lattice structure for a phase mask, is disposed and pressed on a photoresist film 110 to imprint the uneven lattice structure on the photoresist film 110. As the mold 400 is removed from the photoresist film 110, the photoresist film 110 having a lattice portion 111 may be obtained.

For example, the photoresist film 110 or the mold 400 may be heated, or an organic solvent such as ethanol may be provided on a pressed surface of the photoresist film 110, in order to effectively perform the imprinting process.

According to an embodiment, the photoresist film 110 may have a lattice structure formed on a surface thereof. Thus, a PnP process may be performed without a phase mask.

Figure 14:
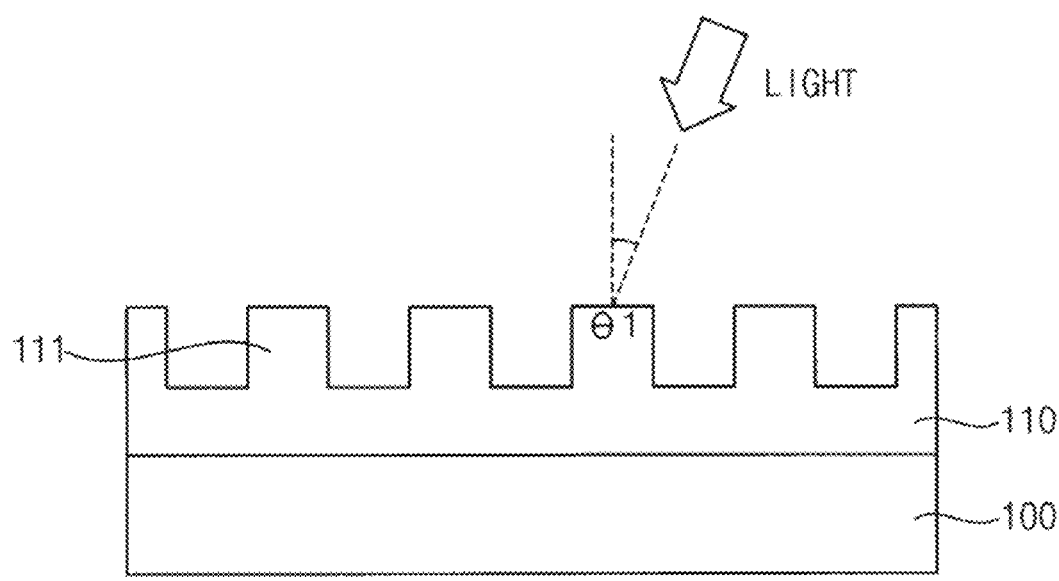

Referring to FIG. 14, the photoresist film 110 may be disposed to be parallel with a horizontal direction, and a light-exposure apparatus may be adjusted so that a light may be irradiated on the photoresist film 110 with a desired incidence angle θ1.

Figure 15:
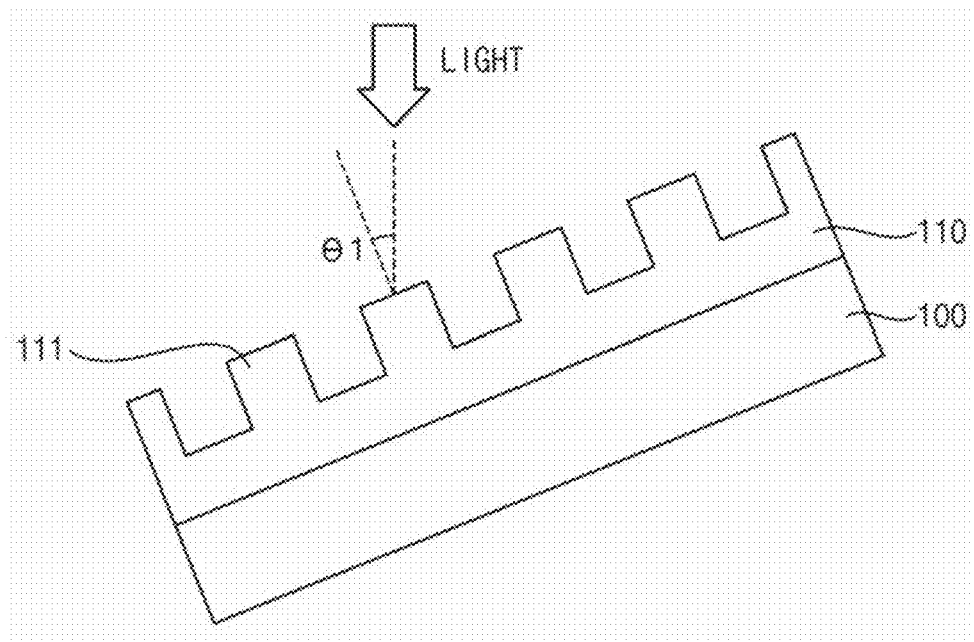

According to an embodiment, referring to FIG. 15, the photoresist film 110 may be disposed to be inclined to a horizontal direction or a ground surface, and a light may be irradiated on the photoresist film 110 in a vertical downward direction to form a desired incidence angle θ1.

Figure 16:
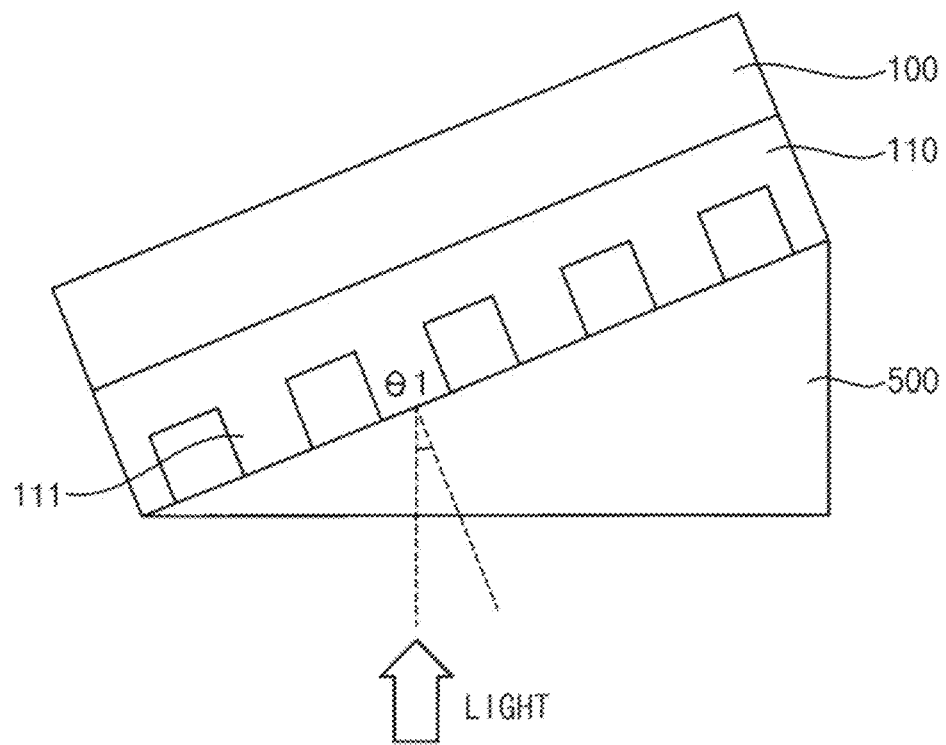

According to an embodiment, referring to FIG. 16, the photoresist film 110 may be disposed on an inclined surface of an inclining jig 500, and a light may be irradiated on the photoresist film 110 through the inclining jig 500 in a vertical upward direction to form a desired incidence angle θ1.

The conventional PnP methods may be able to form only a body-centered-cubic (BCC) structure, a body-centered-tetragonal (BCT) structure and a diamond-like structure as a 3D nano-structure, and a hexagonal-arranged nano-channel structure as a 2D nano-structure. This is because, in the conventional PnP method, a light source is directed to a surface of a photoresist film such that a light from the light source is vertically incident on the photoresist film through a phase mask, and thus, the light has symmetrical distribution of diffraction intensities and diffraction directions. However, the above embodiments may enable formation of different structures that may not be obtained by the conventional PnP methods.

Further, the above embodiments may enable improved process suitability and nano-device performance. For example, a nano-structure obtained from the above embodiments may be used for forming channels of a gate-all-around field-effect transistor (GAA FET). For example, channels (pores) of the nano-structure may be filled with a channel material such as a semiconductor material by a deposition method such atomic layer deposition (ALD) or the like to form electric channels of the GAA FET. After the electric channels are formed, the nano-structure may be entirely or partially removed, and a space obtained from the removal of the nano-structure may be filled with other materials, for example, a conductive material, an insulating material or a semiconductor material.

Furthermore, an arrangement of channels, which may be obtained by the above embodiments, is not limited to a rectangular arrangement, and various other arrangements may be obtained as desired.

Figure 17:
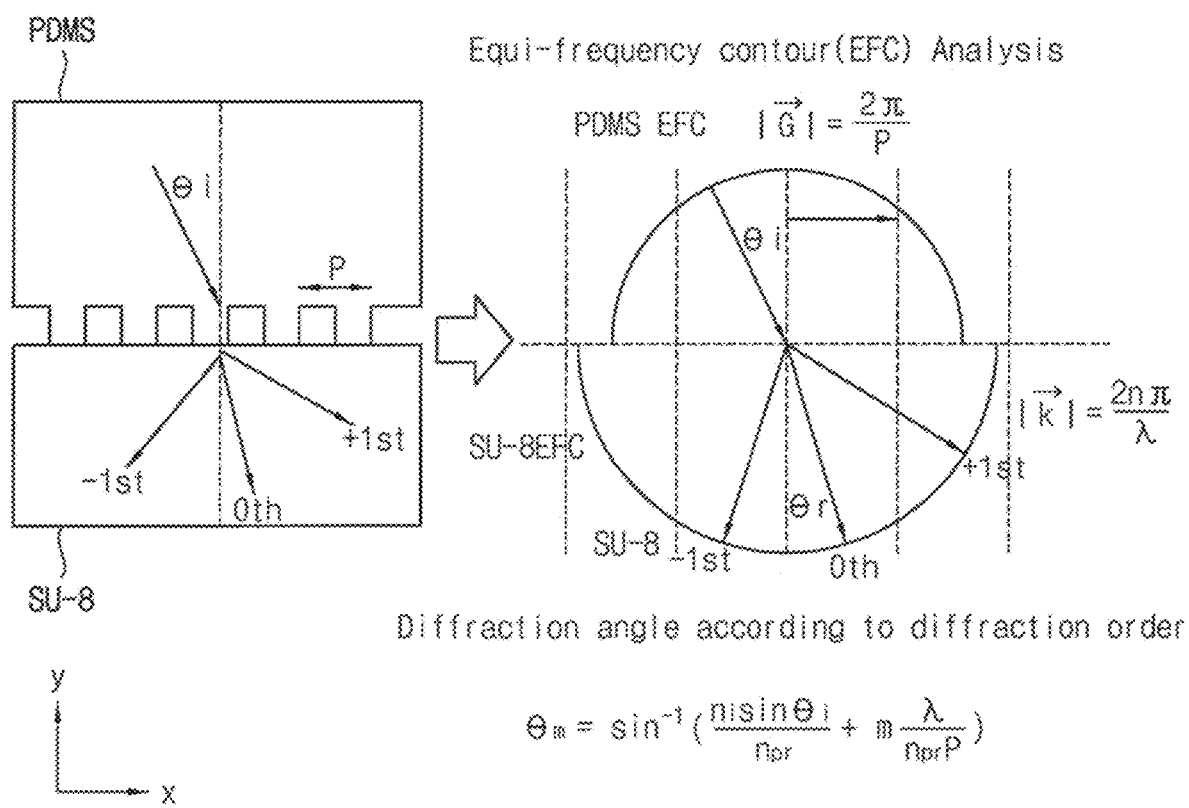
FIG. 17 is a schematic view illustrating diffraction of a light in a PnP method, according to an embodiment.

FIG. 17 is a schematic view illustrating diffraction of a light in a PnP method, according to an embodiment. A practical optical effect in a space may be analyzed by equi-frequency contour (EFC) through Fourier transform. For example, interaction between an incidence angle of a light and a periodicity of a lattice pattern may be explained through the EFC analysis so that it may be verified whether a light is diffracted or not and to verify a diffraction angle of the light.

In FIG. 17, n is a refractive index, m is a diffraction order, P is a period (pitch), G is a grating vector, and k is a wave number. Furthermore, PDMS represents a phase mask, and SU-8 represents a photoresist film.

Figure 18A:
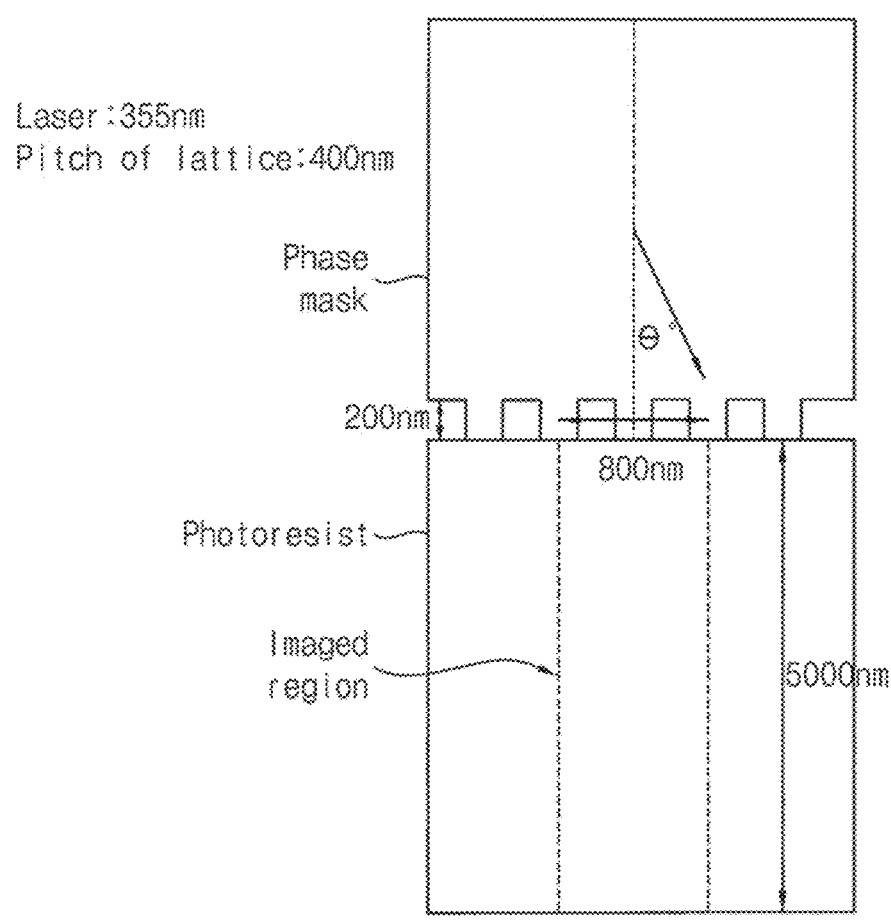
FIG. 18A is a schematic view illustrating diffraction of a light in a PnP method and conditions of a simulation on the EFC analysis illustrated in FIG. 17.
Figure 18B:
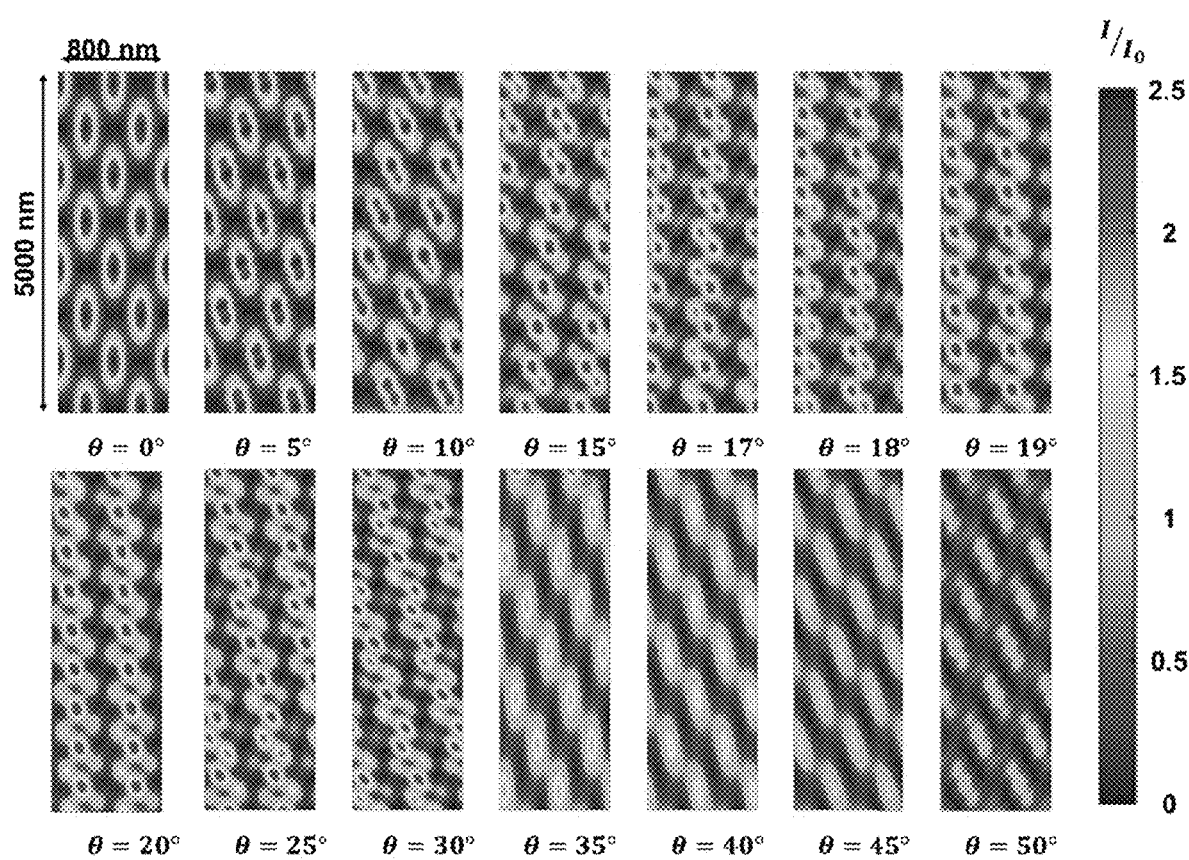
FIG. 18B is an image showing intensity distribution of an electric field depending on an incidence angle on a photoresist film according to a simulation based on the EFC analysis illustrated in FIG. 17.
Figure 19:
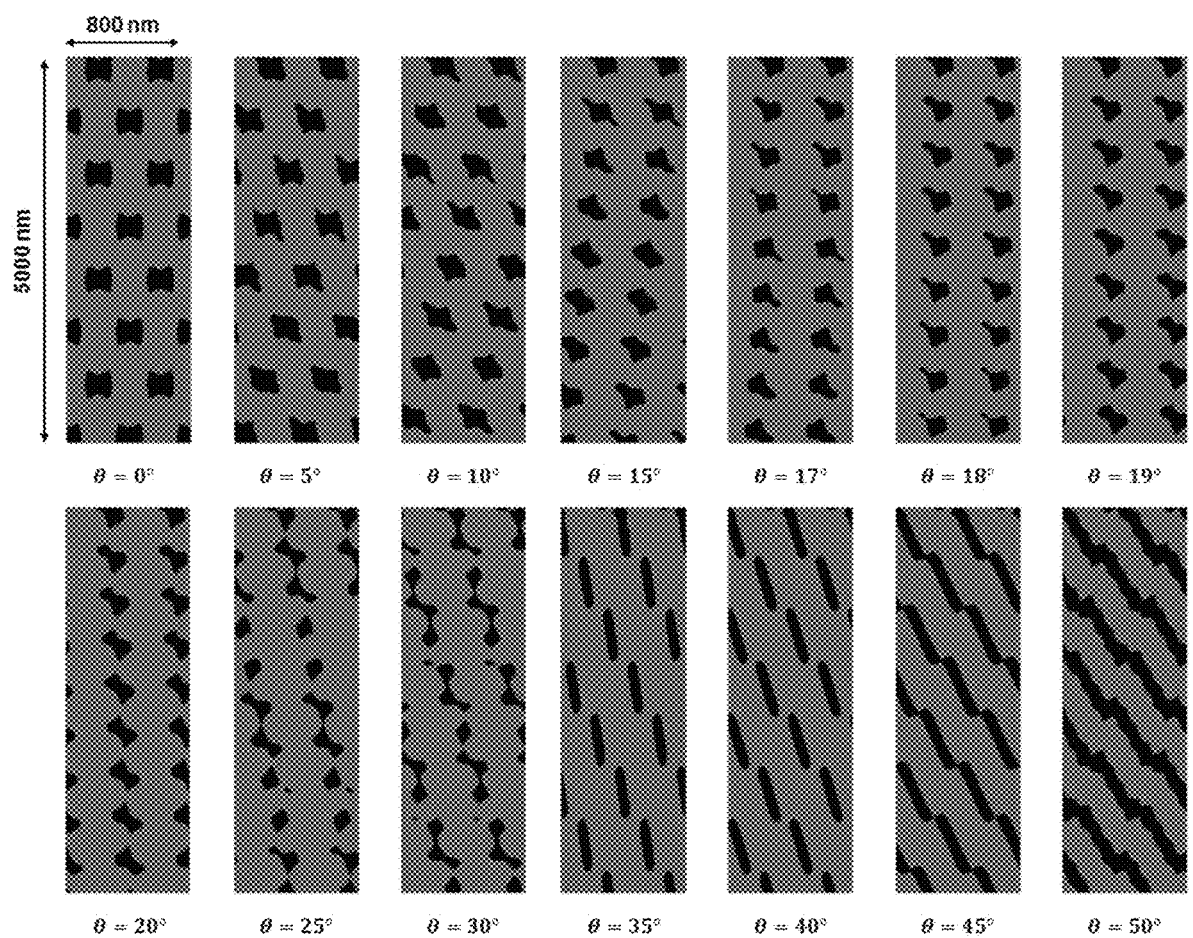
FIG. 19 is a cross-sectional view illustrating a nano-structure depending on an incidence angle on a photoresist film according to the simulation based the EFC analysis on illustrated in FIG. 17.

FIG. 18A is a schematic view illustrating diffraction of a light in a PnP method and conditions of a simulation on the EFC analysis illustrated in FIG. 17. FIG. 18B is an image showing intensity distribution of an electric field depending on an incidence angle on a photoresist film according to a simulation based on the EFC analysis illustrated in FIG. 17. FIG. 19 is a cross-sectional view illustrating a nano-structure depending on an incidence angle on a photoresist film according to the simulation based the EFC analysis on illustrated in FIG. 17.

The simulation was performed such that a wavelength of a light was 355 nm, a period of a lattice structure was 400 nm, a depth of the lattice structure was 200 nm, a refractive index of a phase mask PDMS was 1.4, and a refractive index of a photoresist film was 1.66.

Referring to FIGS. 18A, 18B and 19, when an incidence angle is 0°, channels arranged in (or having) a hexagonal shape or a rhombus shape in a cross-sectional view may be formed. An arrangement of channels may be changed as the incidence angle is varied. For example, it can be noted that channels arranged in a rectangular shape may be formed when the incidence angle is 17° to 20°.

Based on the EFC analysis and the simulation, a light incidence angle for forming channels arranged in a rectangular shape may satisfy the following Formula 1.

$$\sin^{-1}\left[\frac{1}{n_i}\left(\frac{2\lambda}{P}-n_{pr}\right)\right]\langle\Theta_i\langle\sin^{-1}\left[\frac{1}{n_i}\left(n_{pr}-\frac{\lambda}{P}\right)\right] \quad \text{[Formula1]}$$

In Formula 1, $n_i$ is a refractive index of a medium, through which a light passes before entering a photoresist film. $n_{pr}$ is a refractive index of the photoresist film. $\lambda$ is a wavelength of the light in vacuum. P is a period of a lattice structure (period of protrusions). $\theta_i$ is an incidence angle of the light on the photoresist film.

Thus, when a phase mask having the lattice structure is used for forming a 3D distribution of a light, $n_i$ may be a refractive index of the phase mask.

Furthermore, as illustrated in FIGS. 15 and 16, when a photoresist film with a lattice structure is used without a phase mask for forming a 3D distribution of the light, $n_i$ may be about 1.0, which is approximate to a refractive index of an air or vacuum.

COMPARATIVE EXAMPLE

A composition for a high modulus PDMS was spin-coated on a silicon substrate having a lattice pattern, and reaction for cross-linking progressed at 65° C. for 10 minutes. A composition for a low modulus PDMS was provided on the high modulus PDMS layer, and reaction for cross-linking progressed for at least 24 hours. The cured PDMS was separated from the silicon substrate to obtain a phase mask.

A photoresist composition (trade name: SU-8, manufactured by MicroChem) was spin-coated on a glass substrate, and heated on a hot plate at 50° C. to 100° C. for 60 minutes to form a photoresist film. Thereafter, the phase mask was disposed on the photoresist film.

Thereafter, a laser beam having a wavelength of 365 nm was irradiated on the photoresist film through the phase mask with 10 mJ/cm$^2$ to 40 mJ/cm$^2$, and a post-exposure baking was performed at 50° C. to 65° C. for 5 minutes to 15 minutes. Thereafter, the photoresist film was dipped in a PGMEA solution for at least 20 minutes, and supercritical-dried by using carbon dioxide at −8° C. to 45° C. under 15 psi to 1,300 psi to obtain a nano-structure.

EXAMPLE 1

A silicon substrate having a lattice pattern with a high modulus PDMS layer spin-coated thereon was disposed in a container to be inclined by a desired angle. A composition for a low modulus PDMS was provided in the container to surround the silicon substrate and the high modulus PDMS layer. After the composition was cured, the silicon substrate combined with PDMS was taken out of the container and cut to form a phase mask with a jig shape having an inclined surface by 20°.

A photoresist composition (SU-8) was spin-coated on a glass substrate, and heated on a hot plate at 50° C. to 100° C. for 60 minutes to form a photoresist film. The photoresist film was disposed on the inclined surface of the phase mask, and exposed to a light through a same method as Comparative Example 1.

Figure 20:
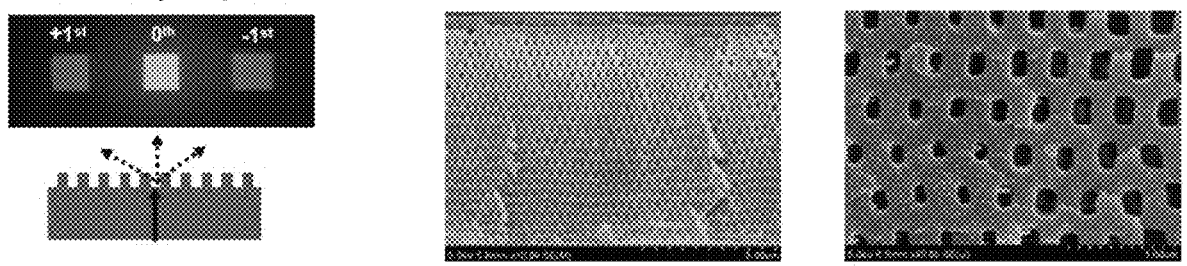
FIG. 20 shows a schematic view of a light diffraction pattern of Comparative Example 1 and scanning electron microscopy (SEM) pictures of a nano-structure obtained by Comparative Example 1.
Figure 21:
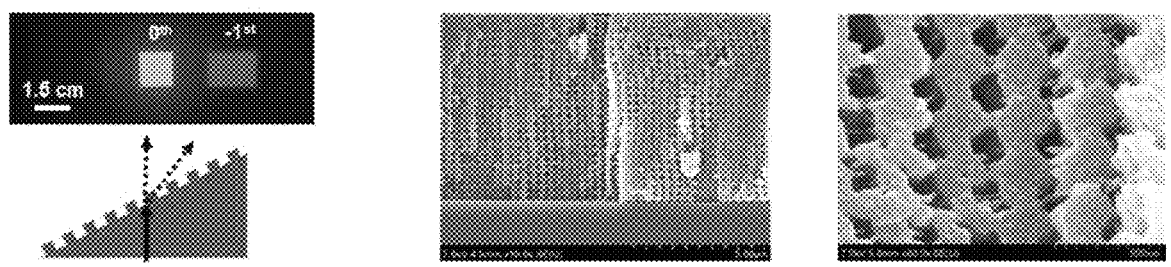
FIG. 21 shows a schematic view of a light diffraction pattern of Example 1 and SEM pictures of a nano-structure obtained by Example 1.

FIG. 20 shows a schematic view of a light diffraction pattern of Comparative Example 1 and scanning electron microscopy (SEM) pictures of a nano-structure obtained by Comparative Example 1. FIG. 21 shows a schematic view of a light diffraction pattern of Example 1 and SEM pictures of a nano-structure obtained by Example 1.

Referring to FIGS. 20 and 21, when an incidence angle was 0°, channels arranged in a hexagonal shape or a rhombus shape in a cross-sectional view were formed, and channels arranged in a rectangular shape were formed when the incidence angle is 17° to 20°.

Figure 22:
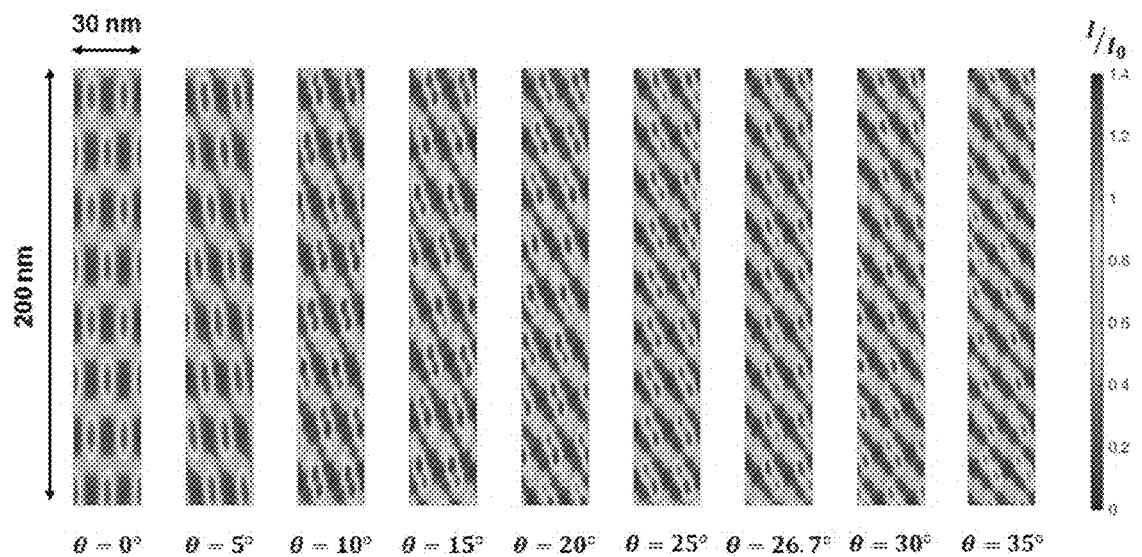
FIG. 22 is an image showing intensity distribution of an electric field depending on an incidence angle on a photoresist film according to a simulation.
Figure 23:
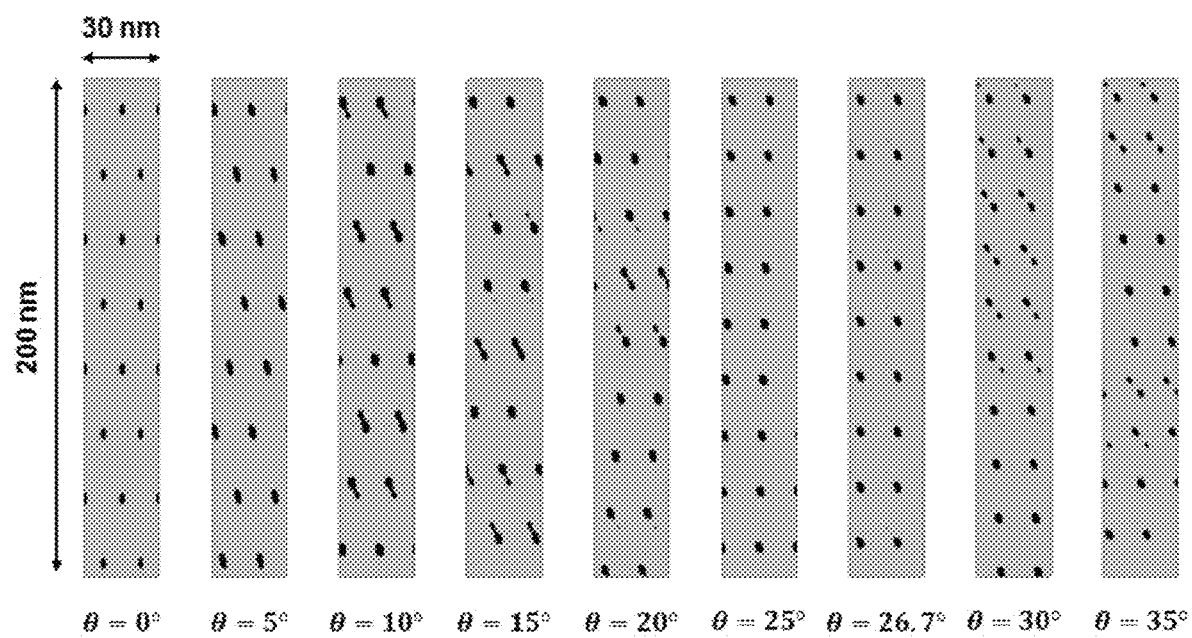
FIG. 23 is a cross-sectional view illustrating a nano-structure depending on an incidence angle on a photoresist film according to the simulation of FIG. 22

FIG. 22 is an image showing intensity distribution of an electric field depending on an incidence angle on a photoresist film according to a simulation. FIG. 23 is a cross-sectional view illustrating a nano-structure depending on an incidence angle on a photoresist film according to the simulation of FIG. 22.

The simulation was performed based on the EFC analysis illustrated in FIG. 17 such that a wavelength of the light was 13.5 nm, a period of the lattice structure was 15 nm, a depth of the lattice structure was 2 nm, a refractive index of a medium on a photoresist film was 1.0 and a refractive index of the photoresist film was 1.7.

Referring to FIGS. 22 and 23, when an incidence angle is 0°, channels arranged in a hexagonal shape or a rhombus shape in a cross-sectional view may be formed. An arrangement of channels may be changed as the incidence angle is varied. For example, it can be noted that channels arranged in a rectangular shape may be formed when the incidence angle is 24° to 27°.

As explained in the above, a nano-structure, which may not be obtained by a conventional PnP method, may be obtained according to the above embodiments. The above embodiments may use various light source such as g-line emitting a light with a wavelength of about 345 nm, h-line emitting a light with a wavelength of about 405 nm, i-line emitting a light with a wavelength of about 365 nm, deep UV emitting a light with a wavelength equal to or less than about 280 nm, extreme UV emitting a light with a wavelength equal to or less than about 120 nm or the like.

A method for fabricating a nano-structure may be used for manufacturing various nano-devices such as a semiconductor device, a sensor, a capacitor or the like.

The foregoing is illustrative of example embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method for fabricating a nano-structure, the method comprising:
   providing a phase mask having an uneven lattice structure to contact a photoresist film;
   exposing the photoresist film to a light through the phase mask such that the light is obliquely incident on a surface of the photoresist film; and
   developing the photoresist film to form a nano-structure, wherein an incidence angle of the light on the photoresist film satisfies the following formula:

$$\sin^{-1}\left[\frac{1}{n_i}\left(\frac{2\lambda}{P}-n_{pr}\right)\right] < \theta_i < \sin^{-1}\left[\frac{1}{n_i}\left(n_{pr}-\frac{\lambda}{P}\right)\right],$$

where $n_i$ is a refractive index of the phase mask, $n_{pr}$ is a refractive index of the photoresist film, $\lambda$ is a wavelength of the light in vacuum, P is a period of the uneven lattice structure, and $\theta_i$ is the incidence angle of the light on the photoresist film.

2. The method of claim 1, wherein the uneven lattice structure has an one-dimensional lattice structure including protrusions extending in a direction, and
   wherein the nano-structure includes a plurality of channels extending in a horizontal direction.

3. The method of claim 2, wherein lines connecting four channels adjacent to each other in a cross-sectional view of the photoresist film form a rectangular shape.

4. The method of claim 1, wherein the phase mask has a prism shape including an inclined surface with the uneven lattice structure, and
   wherein the photoresist film is disposed on the inclined surface so that the light is irradiated on the photoresist film through a lower surface of the prism shape.

5. The method of claim 1, wherein the phase mask includes polydimethylsiloxane (PDMS).

6. The method of claim 1, wherein the phase mask includes a lattice portion including the uneven lattice structure and a film portion combined with the lattice portion, and
   wherein the lattice portion has a modulus greater than the film portion.

* * * * *